(12) United States Patent
Gilliland et al.

(10) Patent No.: US 6,255,902 B1
(45) Date of Patent: Jul. 3, 2001

(54) SWITCH AMPLIFIER CIRCUIT

(75) Inventors: Troy N. Gilliland, New Castle; Steven L. Holmes, Redmond, both of WA (US)

(73) Assignee: Zilog, Inc., Campbell, CA (US)

( * ) Notice: Subject to any disclaimer, the term of this patent is extended or adjusted under 35 U.S.C. 154(b) by 0 days.

(21) Appl. No.: 09/511,512

(22) Filed: Feb. 23, 2000

(51) Int. Cl.[7] ................................................ H03F 1/02
(52) U.S. Cl. ................................................ 330/9; 330/51
(58) Field of Search ................................ 330/9, 51, 69; 327/124, 307

(56) References Cited

U.S. PATENT DOCUMENTS

| | | | |
|---|---|---|---|
| 4,760,346 | * 7/1988 | Kultgen et al. | 330/69 |
| 5,488,322 | 1/1996 | Kaplinsky . | |
| 5,619,066 | 4/1997 | Curry et al. . | |
| 5,742,148 | 4/1998 | Sudo et al. . | |
| 5,789,974 | * 8/1998 | Ferguson, Jr. et al. | 330/2 |
| 5,914,543 | 6/1999 | Scherpenberg et al. . | |
| 5,955,894 | 9/1999 | Vishwanthaiah et al. . | |
| 5,963,088 | * 10/1999 | Czarnul et al. | 330/69 |

OTHER PUBLICATIONS

Pham, Cong–Kha et al. (1993) "CMOS Digital Retina Chip with Multi–bit Neurons for Image Coding", 1193 IEEE *International Symposium on Circuits and Systems* 4:2752–2755.

Scott, Jeffrey W. et al. (1986) "CMOS Implementation of an Immediately Adaptive Delta Modulator", IEEE *Journal of Solid–State Circuits* SC–21(6):1088–1095.

Wang C. –C. et al. (1998) "1GHz 64–bit High–speed Comparator Using ANT Dynamic Logic with Two–phase Clocking", IEE *Proc.–Comput. Digit Tech.* 145(6):433–436.

* cited by examiner

Primary Examiner—Robert Pascal
Assistant Examiner—Henry Choe
(74) Attorney, Agent, or Firm—Skjerven Morrill MacPherson LLP

(57) ABSTRACT

An amplifier circuit with small die size and low power consumption is described. The design allows a number of switch amplifier circuits to be placed on a single chip. Each of the amplifiers contains a comparator for greater amplification, with a designed-in offset, a small pull-down current, and a diode. The comparators are biased with low current values and the need for large resistors is eliminated. Several such devices can be placed on a chip along with an edge triggered shift register to store the logic levels generated from the switch inputs. The offset, either built-in or externally supplied, sets one comparator input to an offset voltage. The switch is connected to the other input, with the diode and pull-down in parallel between this input and ground or other reference level: When the switch is open, the pull-down takes the input to ground; when the switch is closed, the diode voltage drop holds the input to a voltage above the offset. This arrangement also removes the need for key scanning routines and the pre-changing of switches. The use of relatively high gain comparators reduces the sensitivity of the amplifiers to the properties of the switches and micro-processor output ports with which they are used.

32 Claims, 2 Drawing Sheets

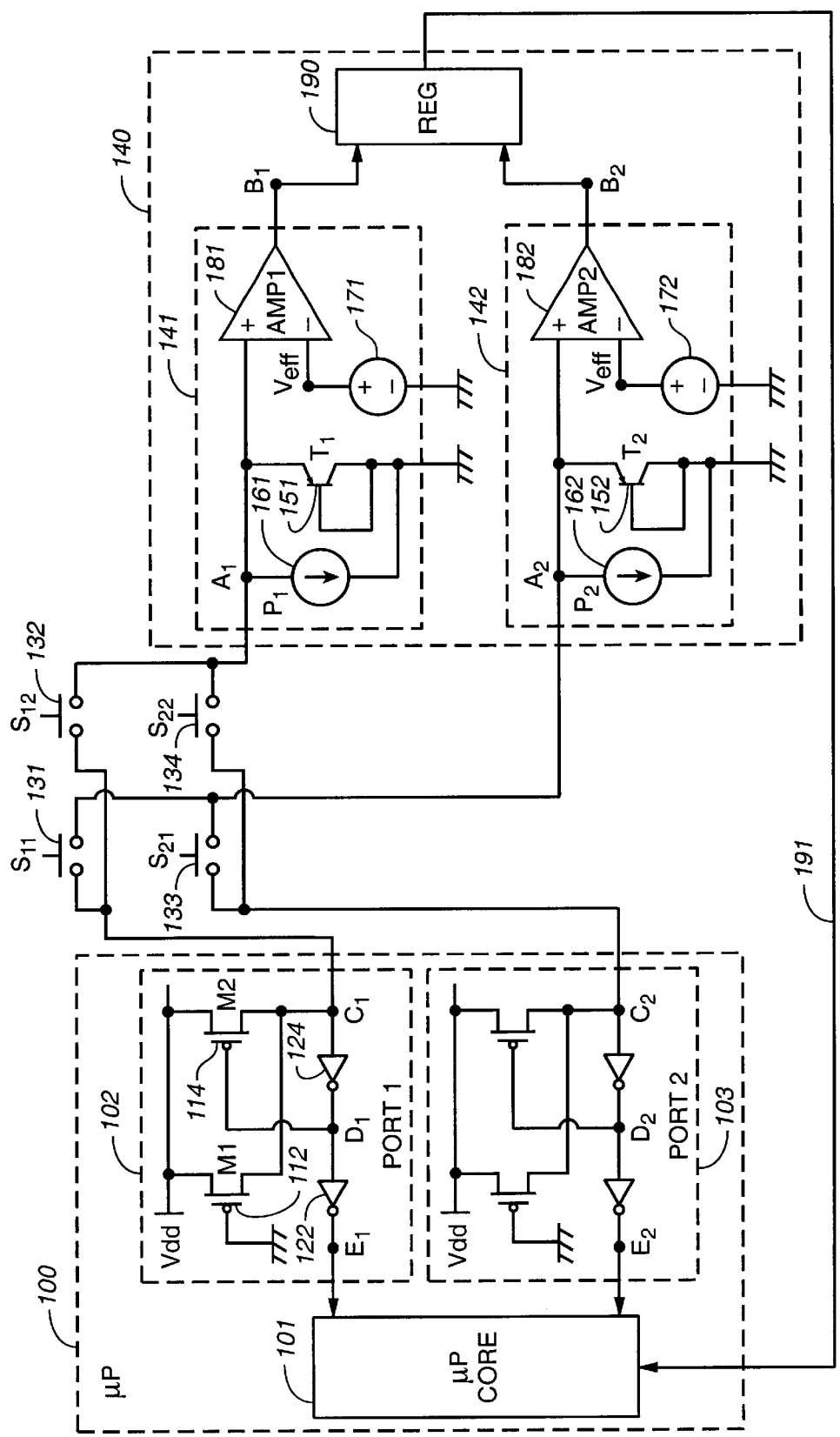
FIG._1

| Node A | Node B |
|---|---|
| $V_A < V_{off}$ | GND (logic low) |
| $V_A > V_{off}$ | $V_{dd}$ (logic low) |

FIG._2A

| $S_{11}$ | $S_{12}$ | $A_1$ | $B_1$ | $A_2$ | $B_2$ | $C_1$ | $D_1$ | $E_1$ |
|---|---|---|---|---|---|---|---|---|
| OPEN | OPEN | GND | GND | GND | GND | $V_{dd}$ | GND | $V_{dd}$ |
| CLOSED | OPEN | GND | GND | $V_1$ | $V_{dd}$ | $V_1$ | $V_{dd}$ | GND |
| OPEN | CLOSED | $V_1$ | $V_{dd}$ | GND | GND | $V_1$ | $V_{dd}$ | GND |
| CLOSED | CLOSED | $V_1$ | $V_{dd}$ | $V_1$ | $V_{dd}$ | $V_1$ | $V_{dd}$ | GND |

FIG._2B

SWITCH AMPLIFIER CIRCUIT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention relates generally to integrated circuit amplifiers and, more particularly, to micro-power switch amplifiers.

2. Background Information

Many circuits need a way for sensing changes in a set of input values and generating a corresponding set of logic values. A common example is the detection of switch operation, where the opening or closing of a switch supplies control information to a micro-controller. A set of pins on the micro-processor will be connected to the switches, the pins acting as current outputs, logic inputs, or both as seen by the switches.

To provide the appropriate logic values back to the processor based upon the input information requires additional circuitry, consisting of not only the switches, but also the various peripheral circuits to convert these inputs into the corresponding logic values. This is commonly done through having a series of discrete circuit elements including some relatively low gain inverters each connected to a switch or some subset of the switches. Since the switches themselves often produce non-negligible impedance, the effects of these impedances are minimized by using large resistances, on the order of several hundred kilo-ohms, in the circuits between the switches and the inverters. The micro-processor senses the closing of the switches by scanning the switches, a process requiring both time and power from the processor as well as the appropriate code to be stored in the memory. Since it is common to use some of the processor pins to both supply input current to the switches as well as receive the logic values back for the processor, additional code must frequently be devoted to a pre-charging routine for these switches.

Although the details of different implementations vary, they all tend to suffer from one or more shortcomings. The need for a number of large value resistors is most easily met by using off chip resistors since the die size they would require cannot easily be produced on a single chip. The use of relatively low power inverters for the switch amplifiers to produce the logic values makes these circuits sensitive to the relation between the parameters in the micro-processor output circuits, in the switches, and in the amplifier circuits themselves. The assembly code needed for the scanning and pre-change routines the processor needs to run to up significant memory space in what are, for most applications, relatively small micro-controllers. Additionally, having a number of such amplifier circuits as well as the pre-changing and scanning of the switches would consume what is, for many applications, large amounts of power since these routines require the micro-controller to be continually scanning and sensing the matrix of switches over and over, using both code space and power. This restricts the utility of such circuits to applications that can provide both the needed space and current.

One particular application is for an array of push-button switches for use with a micro-controller. Such switches are commonly a set of individual push-buttons arranged in rows and columns and used to provide input to the micro-processor chip. In order to read out this input, there would have to be a set discrete amplifiers to create digital logic levels on the rows and columns of the switch array. The logic levels would then be stored in a register for the processor to read. The sort of discrete switch amplifier arrangement described above would be both a limiting factor in reducing the size of a push-button controlled processor and the major source of power consumption, both major limitations since an important application of this technology is in small, battery powered devices such as a remote control or keypad. In addition to their limiting power requirements, prior art methods need off chip components, relatively large code space for special keys can routines to pre-charge the switches, or both. As the number of functions, and the corresponding number of buttons, incorporated on such hand-held, battery-operated has increased at the same time as the contradictory aim of smaller size has grown more important, these shortcomings have become more acute.

BRIEF SUMMARY OF THE INVENTION

The present invention provides an amplifier circuit with small die size and low power consumption, allowing a number of switch amplifier circuits to be placed on a single chip. Each of the amplifiers contains a comparator for greater amplification, with a designed-in offset, a small pull-down current, and a diode. The comparators are biased with low current values and the need for large resistors is eliminated. Several such devices can be placed on a chip along with an edge triggered shift register to store the logic levels generated from the switch inputs. The offset, either built-in or externally supplied, sets one comparator input to an offset voltage. The switch is connected to the other input, with the diode and pull-down in parallel between this input and ground or other reference level: When the switch is open, the pull-down takes the input to ground; when the switch is closed, the diode voltage drop holds the input to a voltage above the offset. This arrangement also removes the need for key scanning routines and the pre-charging of switches. The use of relatively high gain comparators reduces the sensitivity of the amplifiers to the properties of the switches and micro-processor output ports with which they are used.

A preferred application of the device is with an array of push-button switches for providing input information to a micro-processor. The switches are connected to the amplifier circuit on one side and to one or more ports of the micro-processor on the other side. When a switch is pushed, the corresponding logic polarity is stored in the circuits register. The port will also generate an interrupt when the switch is closed so that the micro-processor will then read the register, thereby obtaining the input. This eliminates the need for key scanning as the comparator is ready to receive an input at all times without needing to be monitored, the interrupt serving to wake up the processor to read the input from the switch.

Additional objects, advantages, and features of the present invention will become apparent from the following description of its preferred embodiments, which description should be taken in conjunction with the accompanying drawings.

BRIEF DESCRIPTION OF THE SEVERAL VIEWS OF THE DRAWINGS

FIG. 1 is a diagram showing a pair of the described amplifiers connected to micro-processor ports through a set of switches.

FIGS. 2a and 2b are tables showing typical voltages at specified nodes during the operation of the circuit in FIG. 1.

DETAILED DESCRIPTION OF THE INVENTION

FIG. 1 shows two amplifiers 141 and 142 according to an exemplary embodiment of the present invention. Amplifier 141 has a comparator AMP1 181, with a diode T1 151 and pull-down current P1 161 connected in parallel between one input of the amplifier and ground. A second similarly built amplifier 142 from the corresponding elements AMP2 182, T2 152, and P2 162. Both of the amplifiers AMP1 141 and AMP2 142 have their second input respectively set to offset voltage $V_{off}$ by 171 and 172 and their outputs feeding into a register REG 190. These elements are part of a circuit 140, which is preferable formed as a single integrated circuit. The two comparators are shown in an application as a switch amplifier, connected through switches $S_{11}$, 131, $S_{12}$ 132, $S_{21}$ 133, and $S_{22}$ 134 to a pair of ports 102 and 103 of micro-processor 100. Although FIG. 1 contains only 2×2 array of switches and a corresponding pair of amplifiers, these are meant to represent a larger number of switches with either an amplifier for each switch or, as in the more common arrangement shown here, with an array of switches arranged as rows and columns and the amplifiers connected on the rows and the micro-processor ports connected on the columns to create digital logic levels in the conventional manner. In either case, all of the comparators could form part of circuit 140. The switches 131–134 are connected on their other side to micro-processor $\mu P$ 100. The ports 102 and 103 of $\mu P$ 100 are given in some detail in order to show an example of how the port can indicate to the processor that one of the switches has been closed, but the rest of $\mu P$ 100 is just shown as the block $\mu P$ CORE 101 in order to simplify the figure, with line 191 included so that the processor is able to read register REG 190. Although shown separately, a unified embodiment would place the elements of circuit 140 and the same monolithic substrate as $\mu P$ 100 as part of a single integrated circuit.

FIG. 1 presents a particular embodiment, namely a CMOS circuit operating between respective logic low and high values of ground and $V_{dd}$, with the diode formed in a particular manner, and showing the voltage offset as an explicit element. More generally, the circuit can be implemented in any of the standard technologies (BiCMOS, GaAs, SiGe, and so on) and the various operating voltage levels can be inverted in the familiar way. Also, the implementation and number of the various elements shown are one particular design choice. Although the variations are often noted below, when a concrete example is needed, reference is to the embodiment of FIG. 1.

The following discussion starts with the operation of the comparator. Its use as a switch amplifier and its relation to the shown micro-processor port is then given, followed by how the structure extends to a larger switch array.

Consider the amplifier circuit 141 connected to switches $S_{12}$ 132 and $S_{22}$ 134. Circuit 141 is composed of comparator AMP1 181, pull-down current $P_1$. 161, transistor $T_1$ 151, and input offset voltage $V_{off}$ 171. Node $A_1$ is the voltage supplied, in this arrangement, to comparator's positive input, with node $B_1$ the corresponding output voltage. From node $A_1$, the pull-down $P_1$ 161 and diode connected transistor $T_1$ 151 are connected in parallel to the voltage corresponding to logic low. Through out the remaining discussion, this logic low is usually referred to as ground, although the discussion readily extends to a more general value. The small pull-down $P_1$ 161 functions as a high value resistor that serves to hold the voltage at node $A_1$, $V_A$, to ground when the input is not connected. The implementation of this pull-down is process dependent: For example, in a CMOS implementation, an effective method of creating a large resistance is to use MOSFETs operating in their linear region. The transistor $T_1$ 151 functions as a diode placed between node $A_1$ and ground, so that when this node is connected to a current source, a voltage drop $V_1$ occurs across this element and the node $A_1$ is placed at a voltage $V_A=V_1$ above ground. In FIG. 1, this diode is formed from a pnp bipolar junction transistor with its base and collector both tied together at ground as one example of an area efficient diode implementation. More generally, any process appropriate diode implementation, such as formed from a transistor or just a p-n junction, can be used to produce the required voltage drop.

This parallel arrangement of the pull-down and the diode holds the non-inverting input of the comparator to the logic low value when the input is unconnected to a current source, as $P_1$ 161 will pull node $A_1$ down to this value, while shifting its level up by $V_1$ when the input is connected to a current source. The effective value of the resistance for $P_1$ 161, $R_{P1}$, is taken large enough so that $V_1$ is effectively determined by $T_1$ 151. For the specific CMOS implementation using a MOSFET operating in its linear region, a value of $R_{P1}$ on the order of 50 k$\Omega$ is used. More generally, a FET operating in either its linear or saturated region with resistance of over, say, 10 k$\Omega$ is suitable, although the particular value is not overly critical as long as it is high enough to allow the diode to determine the voltage drop from node $A_1$ by being, for example, an order of magnitude higher than the "on" resistance of diode $T_1$ 151. Depending on the circuit implementation and needed resistance, any of the appropriate techniques for forming this pull-down can be used.

The offset voltage $V_{off}$ is shown explicitly as elements 171 and 172 connected to respective comparators AMP1 181 and AMP2 182 in FIG. 1, although in practice an actual voltage source may not be connected to this input. As is a common convention, the comparator is drawn as ideal—that is, having no offset voltage—and the actual offset voltage is represented by this voltage source. In one set of embodiments, "$V_{off}$" represents the input referred offset of the comparator, and that in actuality a voltage source such as 171 is not really connected inverting output of AMP1 181. With every type of amplifier there is always an input referred offset voltage, which normally one would want to minimize. In this case, it would instead be designed with a larger than normal input-referred offset voltage. Alternately, the circuit will operate the same if 171 just a regular voltage source of an additional value to supply the additional voltage needed to set the offset of the comparator to $V_{off}$ (i.e., $V_{off}$ minus the offset voltage due to the comparator being less than ideal). In the case that 171 and 172 are real voltage sources, they could of course be supplied by the same source.

In either case, the designed-in offset voltage $V_{off}$ 171 raises the inverting input of the comparator AMP1 141 by $V_{off}$ above the logic low value. By arranging for $V_1$ to be suitable larger than $V_{off}$, say $V_1 \approx 2V_{off}$, when node $A_1$ is left unconnected, $V_A$ is taken to ground and, consequently, the output at node $B_1$ is also at ground; when node $A_1$ is connected, it is placed at $V_A=V_1>V_{off}$ and, consequently, the output at node $B_1$ goes to $V_{dd}$. FIG. 2a summarizes this behavior. Of course, the shown values can be reversed by reversing the shown voltages to operate the circuit "upside down". More generally, the comparator would operate between two logic levels with the $V_{off}$ being the amount of offset from a first of these logic levels toward the second level and the comparator output being different logic levels depending the relation of $V_A$ to $V_{off}$. The diode would then be oriented to set $V_1$ in the same direction as, but with a greater magnitude than, $V_{off}$ with respect to the first logic level. (Although $P_1$ 161 and $P_2$ 162 are referred to as pull-downs, they are more accurately "pull-ups" when the circuit is constructed "up-side down"; however, since their function is clear from their connections—and a more general terminology would be awkward—they are simply referred to as pull-downs here in both situations.)

For use as a push-button-switch amplifier or similar application, a suitable value for the designed-in offset $V_{off}$ is approximately 150–300 mV, with $V_1$ in the range of 500–700 mV. The comparators are biased with a very small current, drawing a current on the order of 80–160 nA when the switches are open. As the switches are normally open, the total power draw is determined by the bias circuit, with an additional draw from the current source (such as M1 112) only when a switch is closed. The bias current is made small to reduce this power draw and does not have a major effect on circuit performance. This results in a low power circuit even though the comparator stays in a state ready to receive a data input. This eliminates both the code needed to perform the sort of keypad scanning found in the prior art circuits described in the Background section, as well the power consumption needed to pre-charge the switches in these key scan routines. Additionally, as both the comparator and the bias circuit are relatively small, and no large off-chip resistances are needed, this circuit is readily implemented within a single integrated circuit, whether in CMOS or one of the other technologies.

Circuit 140 would generally contain a number of circuits such as amplifier 141, although only a second such circuit 142 is shown here. The outputs from the comparators AMP1 181 and AMP2 182 pass through nodes $B_1$ and $B_2$, respectively, and are held in a register REG 190, also part of 140, whose values can be read out along line 191. The inclusion of REG 190 as part of the circuit 140 is optional and a number of variations are possible. One set of alternate embodiments would just send the outputs $B_1$ and $B_2$—and any additional $B_i$ from additional amplifiers—directly to µP core 101 in parallel. Alternately, these values could be held in REG 190 on circuit 140, but still read out in parallel by µP 100. (Or course in a unified embodiment where µP 100 and amplifier circuit 140 are part of a single integrated circuit, it becomes less clear whether a register such as 190 belongs to the amplifier circuit or is just a micro-controller register.) The embodiment shown for FIG. 1, however, is for REG 190 to be part of the circuit 140 with a serial line 191 to the processor. The register would then be read through use of a select line and a clock signal from µP 100, both of which are suppressed in FIG. 1. Many specific implementations of the edge triggered register REG 190 are possible as long as the change in logic levels on the comparator outputs is noted. A preferred implementation uses a negative edge triggered one-shot prior to a positive-edge triggered register. This register then loads a shift register, which is then able to shift the data onto the micro-controller.

In this way, a number of low powered comparators with adjustable thresholds can be contained on a single chip instead of using a corresponding number of discrete amplifiers to create digital logic levels. The inputs to the chip are the values to be compared, the output is the corresponding register values determined by whether the inputs are above or below the offset value. Additionally, by using comparators, greater amplification can be obtained than by the use of inverters as is common in the prior art. Depending on the particular implementation, the comparators will have a gain of $10^3$–$10^4$, one to three orders of magnitude greater gain than produced from inverters. This allows looser tolerances on other components in the circuit (diodes, resistors, and so on) because the inputs are much more sensitive. For instance, although the prior art designs commonly required large, and consequently off-chip, resistors so that the relative resistance of the switches would be small, the present design can withstand very large switch resistances, for example on the order of 500Ω, and function on input currents ranging from below 50 µA to on the order of several hundred microamps.

In the exemplary two input embodiment shown, the input information comes from a 2×2 array of standard off-chip push button switches, with the first column switches $S_{11}$ 131 and $S_{21}$ 133 connected to the second amplifier circuit 142 through node $A_2$ and the second column switches $S_{12}$ 132 and $S_{22}$ 134 connected to the first amplifier circuit 141 through node $A_1$. Both of the first row switches are connected to micro-controller µP 100 through PORT1 102, while the second row switches are connected through PORT2 103. In FIG. 1, line 191 is simply connected back to µP 100, enabling the micro-processor to read out the contents of the register and determine which column of switches have been pushed. FIG. 1 shows the micro-processor port 102 in some detail to help illustrate its interaction with circuit 140 through the switches, with the workings of the rest of µP 100 suppressed, both to keep the figure simple and because these are standard and not specific to the present invention.

Micro-processor ports 102 and 103 are also not meant to be overly specific, but just to represent one possible design. The relevant property is that PORT1 102 will generate a current through either node $A_1$ or node $A_2$ when respective switch $S_{12}$ or $S_{11}$ is closed, as will PORT2 103 when the corresponding second row switch is closed. Additionally, the ports will indicate to the µP Core 101 that one or more switches have been pushed, in effect generating an interrupt for the micro-controller to read out the contents of register REG 190 through line 191.

The lower micro-processor port, PORT2 103, and the second row of switches, $S_{21}$ 133 and $S_{22}$ 134, are ignored for the moment. Transistors M1 112 and M2 114 are connected in parallel between node $C_1$ and the high logic values $V_{dd}$. Both of these transistors are constructed with a length much longer than their width and, consequently, a high impedance when on. M1 acts as a pull-up resistor, as does M2 when node $D_1$ is at ground. (The gate of M2 is connected to $D_1$ to provide positive feed back, but this again a design choice and not critical to the behavior described here.) When both switches $S_{11}$ 131 and $S_{12}$ 132 are open, node $C_1$ will thus be pulled up to $V_{dd}$. Due to the pair of inverters 124 and 122, node $D_1$ will be inverted from node $C_1$ and at ground, while node $E_1$ is inverted again and set at $V_{dd}$. Since no current flow across the switches, both of nodes $A_1$ and $A_2$ and are respectively pulled down to ground by $P_1$ 161 and $P_2$ 162. This situation is summarized in the top line of FIG. 2b.

When one of the switches is closed, say $S_{12}$ 132, a current then flows across this switch and into node $A_1$. As described above, this places node $A_1$ at $V_1$ and node $B_1$ at $V_{dd}$, this change being registered in REG 190. Taking any voltage drop across switch $S_{12}$ 132 as negligible, node $C_1$ will also be at $V_1$. In any case, $V_1$ is sufficiently below $V_{dd}$, inverter 124 takes node $D_1$ to $V_{dd}$ and inverter 122 takes node $E_1$ to ground. As node $D_1$ is at $V_{dd}$, transistor M2 114 is shut off. The current path is then through M1 112, through node $C_1$ and switch $S_{12}$ 132 to node $A_1$, passing from there through diode connected transistor T1 151 to ground, with nodes $C_1$ and $A_1$ both at $V_1$. This situation is described in the third line of FIG. 2b. Again, for the shown embodiment, $V_1$ is typically in the range of 500–700 mV with a current flow on the order of 50 μA being common. As noted above, the design of circuit 141 makes it extremely tolerant of variations in these values. The bulk of the current consumption in the combined operation of PORT1 102 and circuit 140 is thus due to port operation, and in particular due to transistors M1 and M2, as this flow is several orders of magnitude greater than that needed to bias the comparators.

If switch $S_{11}$ 131 is closed instead of $S_{12}$ 132, the result is the same as seen from the output port, but now with node $A_2$ instead of $A_1$ taken to $V_1$ and the corresponding changes as shown in the second line of FIG. 2b. The last line of this figure represents the state of the various nodes when both switches $S_{11}$ 131 and $S_{12}$ 132 are closed. Thus, when any single switch or any combination of switches from the first row are closed, node $E_1$ is taken to ground. This indicates to the processor that a switch has been pushed and the corresponding data can be found in register REG 190. In this way, in addition to recording which switch has been pushed, a signal suitable as interrupt is generated to wake up the processor to read out the data stored in REG 190 along line 191. As this interrupt comes from PORT1 102 through node $E_1$, the processor also knows that the data comes from the top row of switches in this arrangement.

PORT2 103 functions the same way with respect to switches $S_{21}$ 133 and $S_{22}$ 134 and amplifier circuit 142 as does for PORT1 102 with respect to $S_{11}$ 131 and $S_{12}$ 132 and amplifier circuit 141. The description above readily translates to the lower port and row of switches, the difference largely consisting of a change in subscripts. In either case, the important property is that the port serves as a current source to allow the amplifier circuit to convert the information input from the switches into logic levels. Although the corresponding level change in nodes $E_1$ and $E_2$ is not required for this, the shift of this node from a logic high to a logic low, or the other way around, is useful both as a wake up for the processor and to identify the row to which the closed switch belongs.

Even though the discussion so far and FIG. 2b describe only two switches and a single output port in detail, this scheme readily extends to a larger array. A typical embodiment would in practice use a larger number of switches, such as the embodiment shown in FIG. 1. Although circuit 140 could be connected with one amplifier for each switch, switch arrays are commonly arranged into rows and columns. As such, amplifiers could be provided for the columns with different micro-processor ports corresponding to the rows, or vice versa, to create corresponding logic levels of the individual switches. The correspondence between these and the particular switch in the array could then be determined in the processor μP 100. Additionally, the switches could be divided into two or more subsets, each fed by a different port such as 102. This would allow the processor to distinguish between the different subsets based upon the generated interrupts, generated at the respective nodes E, prior to reading out REG 190. This could be used if, for example, the processor wished to prioritize how to respond to these subsets.

Due to the small die size and low power requirements of circuit 140, it is readily combinable into a unified embodiment with micro-processor μP 100. In this case, all of the elements shown in FIG. 1 except for the switches themselves would be formed as part of a single integrated circuit. Register REG 190 could then be treated as part of the micro-processor core 101. For a two port, two amplifier arrangement such as shown in FIG. 1, the combined 100/140 circuit would then have four external pins, corresponding to nodes $C_1$, $C_2$, $A_1$, and $A_2$, with the respective inputs into the core 101 now corresponding to nodes $E_1$, $E_2$, $B_1$, and $B_2$. The general case would, of course, have the appropriate number of $A_i$, $B_i$, $C_j$, and $E_j$.

Finally, although the discussion has been framed in terms of a push-button-switch amplifier application, the described integrated circuit 140 is suitable for other applications requiring a number of low power comparators with an adjustable threshold for switching and other uses. By placing the low power switch amplifiers on a single integrated circuit, it is particularly useful for battery powered applications when minimal size is important. Additionally, as it requires no special code to operate, since it is essentially on at all times despite requiring little power, and is highly tolerant of variations in the input parameters, due the use of comparators, the design of integrated circuit 140 is readily implemented in these applications without requiring special adaptations or tuning of elements.

Various details of the implementation and method are merely illustrative of the invention. It will be understood that various changes in such details may be within the scope of the invention, which is to be limited only by the appended claims.

What is claimed is:

1. A circuit, comprising:
    a current source;
    a switch having a first terminal and a second terminal, said first terminal connected to said current source, whereby when said switch is closed, a current is supplied to said second terminal; and
    an amplification circuit, comprising:
        a comparator having a first input and an output, said first input being connectable through a node to an external input connectable to a current source, said comparator having an offset with respect to a first logic level of a voltage $V_0$ toward a second logic level, wherein when said first input is at a voltage on the same side of said offset as said first logic level, said output is set at said first logic level, and wherein when said first input is at a voltage on the same side of said offset as said second logic level, said output is at said second logic level;
        a pull-down connected between said node and said first logic level; and
        a diode connected between said node and first logic level in parallel to said pull down, whereby when said external input is connected to said current source said node is offset with respect to said first logic level by a voltage $V_1$ toward said second logic level when said amplifier circuit input is connected to a current source, and wherein $V_1$ is greater than $V_0$.

2. The circuit of claim 1, wherein said amplification circuit is formed as part of a single integrated circuit.

3. The circuit of claim 2, wherein $V_0$ is in the range of from 150 mV to 300 mV.

4. The circuit of claim 3, wherein $V_1$ is in the range of from 500 mV to 700 mV.

5. The circuit of claim 2, wherein said amplification circuit further comprises:
    a edge triggered register connected to said output.

6. The circuit of claim 5, wherein said current source comprises:

a micro-processor, comprising:
- a core connected to read said register; and
- a port, connected to said core through a second node and connected to said first terminal, wherein when said switch is closed, said port supplies said current.

7. The circuit of claim 6, wherein said current source is part of said single integrated circuit, and wherein said register is readable by said micro-processor.

8. The circuit of claim 7, wherein when said switch is closed, said second node is at said first logic value, and wherein when said switch is open, said second node is at said second logic value.

9. The circuit of claim 5, wherein said register is readable externally from said integrated circuit.

10. An integrated circuit, comprising:
   a plurality of amplifiers, each of said amplifiers comprising:
   - a comparator having a first input and an output, said first input being connectable through a node to an external input connectable to a current source, said comparator having an offset with respect to a first logic level of a voltage $V_0$ toward a second logic level, wherein when said first input is at a voltage on the same side of said offset as said first logic level, said output is set at said first logic level, and wherein when said first input is at a voltage on the same side of said offset as said second logic level, said output is at said second logic level;
   - a pull-down connected between said node and said first logic level; and
   - a diode connected between said node and first logic level in parallel to said pull down, whereby when said external input is connected to said current source said node is offset with respect to said first logic level by a voltage $V_1$ toward said second logic level when said amplifier circuit input is connected to a current source, and wherein $V_1$ is greater than $V_0$; and
   a edge triggered register connected to the outputs of said plurality of comparators.

11. The integrated circuit of claim 10, wherein said integrated circuit is formed as a CMOS integrated circuit.

12. The integrated circuit of claim 11, wherein said diode is formed from a bipolar junction transistor.

13. The integrated circuit of claim 10, wherein said pull-down is formed from a FET transistor operating in its linear region.

14. The integrated circuit of claim 10, wherein said pull-down is formed from a FET transistor operating in its saturated region.

15. The integrated circuit of claim 10, wherein $V_0$ is in the range of from 150 mV to 300 mV.

16. The integrated circuit of claim 15, wherein $V_1$ is in the range of from 500 mV to 700 mV.

17. The integrated circuit of claim 10, wherein $V_0$ is the input referred offset of said comparator.

18. The integrated circuit of claim 10, wherein said comparator further includes a second input, further comprising:
   a voltage source connected to said second comparator input, thereby establishing said voltage $V_0$.

19. The integrated circuit of claim 10, further comprising:
   a micro-processor connected to said register.

20. The integrated circuit of claim 19, wherein said micro-processor comprises a port capable of supplying current externally to the integrated circuit through an external output, wherein said port indicates to said micro-processor whether said external port is at a voltage above or below a reference voltage $V_2$.

21. The integrated circuit of claim 10, wherein said register is readable externally from said integrated circuit.

22. An integrated circuit comprising a switch amplification circuit having an input and an output, wherein said amplification circuit input is connectable externally to the integrated circuit, said switch amplification circuit comprising:
   - a comparator including a first input and an output, said first input being connected to said switch amplification circuit input through a first node and said output being connected to said switch amplification circuit output through a second node, said comparator having an offset with respect to a first logic level of a voltage $V_0$ toward a second logic level, wherein when said first comparator input is at a voltage on the same side of said offset as said first logic level, said output is set at said first logic level, and wherein when said first comparator input is at a voltage on the same side of said offset as said second logic level, said output is at said second logic level;
   - a high impedance pull-down, wherein said pull-down is connected between said first node and said first logic level; and
   - a diode having a forward voltage drop $V_1$, where in said diode is connected between said first node and said first logic level in parallel to said pull-down and oriented so that said first node is offset with respect to said first logic level by the voltage $V_1$ toward said second logic level when said amplifier circuit input is connected to a current source, and wherein $V_1$ is greater than $V_0$.

23. The integrated circuit of claim 22, wherein said amplification circuit is formed as a CMOS integrated circuit.

24. The integrated circuit of claim 23, wherein said diode is formed from a bipolar junction transistor.

25. The integrated circuit of claim 22, wherein said pull-down is formed from a FET transistor operating in its linear region.

26. The integrated circuit of claim 22, wherein said pull-down is formed from a FET transistor operating in its saturated region.

27. The integrated circuit of claim 22, wherein $V_0$ is in the range of from 150 mV to 300 mV.

28. The integrated circuit of claim 27, wherein $V_1$ is in the range of from 500 mV to 700 mV.

29. The integrated circuit of claim 22, wherein $V_0$ is the input referred offset of said comparator.

30. The integrated circuit of claim 22, wherein said comparator further includes a second input, further comprising:
   a voltage source connected to said second comparator input, thereby establishing said voltage $V_0$.

31. The integrated circuit of claim 22, further comprising:
   a micro-processor connected to said amplification circuit output.

32. The integrated circuit of claim 31, wherein said micro-processor comprises a port capable of supplying current externally to the integrated circuit through an external output, wherein said port indicates to said micro-processor whether said external output port is at a voltage above or below a reference voltage $V_2$.

* * * * *